US008273886B2

(12) United States Patent
Afzali-Ardakani et al.

(10) Patent No.: US 8,273,886 B2
(45) Date of Patent: Sep. 25, 2012

(54) RADIATION SENSITIVE SELF-ASSEMBLED MONOLAYERS AND USES THEREOF

(75) Inventors: Ali Afzali-Ardakani, Ossining, NY (US); Cherie R. Kagan, Ossining, NY (US); Laura L. Kosbar, Mohegan Lake, NY (US); Sally A. Swanson, San Jose, CA (US); Charan Srinivasan, State College, PA (US)

(73) Assignee: International Business Machines Corporation, Armonk, NY (US)

( * ) Notice: Subject to any disclaimer, the term of this patent is extended or adjusted under 35 U.S.C. 154(b) by 1064 days.

(21) Appl. No.: 12/199,607

(22) Filed: Aug. 27, 2008

(65) Prior Publication Data

US 2008/0318157 A1 Dec. 25, 2008

Related U.S. Application Data

(63) Continuation of application No. 11/445,326, filed on Jun. 2, 2006, now Pat. No. 7,531,293.

(51) Int. Cl.
*C07F 7/02* (2006.01)
*C07F 9/06* (2006.01)
*C07F 9/02* (2006.01)
*C07D 213/22* (2006.01)

(52) U.S. Cl. ............ 546/14; 546/22; 546/257; 558/189; 562/11

(58) Field of Classification Search .................. None
See application file for complete search history.

(56) References Cited

U.S. PATENT DOCUMENTS

2002/0084429 A1 7/2002 Craighead et al.
2004/0163758 A1 8/2004 Kagan et al.
2005/0048411 A1 3/2005 Leggett

OTHER PUBLICATIONS

Database Caplus Chemical Abstracts Service, Columbus, Ohio, US; Database Accession No. 1998:625508, Abstract of De Napoli et al., Tetrahedron Letters (1998), 39(40), 7397-7400.*
Database Caplus Chemical Abstracts Service, Columbus, Ohio, US; Database Accession No. 1991:429632, Abstract of EP 420806.*
Database Accession No. 1994:217634, Abstract of Sieburth et al., Journal of Organic Chemistry (1994), 59(1), 80-7.*
J. Jung et al., "Improvement of Pattern Collapse in Sub-100nm Nodes", Proceedings of SPIE, vol. 5039. 2003, p. 1298.
T. Yoshimura et al., "Correlation of Nano Edge Roughness in Resist Patterns with Base Polymers", Japan J. Appl. Phys., vol. 32, 1993, pp. 6065-6070.
C. Taylor et al., "Octadecanoic Acid Self-Assembled Monolayer Growth at Sapphire Surfaces", Langmuir, vol. 19, 2003, pp. 2665-2672.

(Continued)

*Primary Examiner* — Karl J Puttlitz
(74) *Attorney, Agent, or Firm* — Connolly Bove Lodge & Hutz LLP; Vazken Alexanian

(57) ABSTRACT

The invention is directed to a radiation sensitive compound comprising a surface binding group proximate to one end of the compound for attachment to a substrate, and a metal binding group proximate to an opposite end of the compound. The metal binding group is not radiation sensitive. The radiation sensitive compound also includes a body portion disposed between the surface binding group and the metal binding group, and a radiation sensitive group positioned in the body portion or adjacent to the metal binding group. The surface binding group is capable of attaching to a substrate selected from a metal, a metal oxide, or a semiconductor material.

5 Claims, 2 Drawing Sheets

OTHER PUBLICATIONS

M. Fang et al., "A "Mix and Match" Ionic-Covalent Strategy for Self-Assembly of Inorganic Multilayer Films", J. Am. Chem. Soc., vol. 119, 1997, pp. 12184-12191.

C. Lin et al., "Layer-By-Layer Growth of Metal-Metal Bonded Supramolecular Thin Films and Its Use in the Fabriaction of Lateral Nanoscale Devices", J. Am. Chem. Soc., vol. 125, 2003, pp. 336-337.

A. Hatzor et al., "A Metal-Ion Coordinated Hybrid Multilayer", Langmuir, vol. 16, 2000, pp. 4420-4423.

R. Smith et al., "Patterning Self-Assembled Monolayers", Progress in Surface Science, vol. 75, 2004, pp. 1-68.

D. Ryan et al., "Patterning Multiple Aligned Self-Assembled Monolayers Using Light", Langmuir, vol. 20, 2004, pp. 9080-9088.

M. Zharnikov et al., "Modification of thiol-derived self-assembling monolayers by electron and x-ray irradiation: Scientific and lithographic aspects", J. Vac. Sci. Technol. B, vol. 20, No. 5, 2002, pp. 1793-1807.

J. Calvert, "Lithographic patterning of self-assembled films", J. Vac. Sci. Technol. B, vol. 11, No. 6, 1993, pp. 2155-2163.

C. Li et al., "Charge Storage Behavior of Nanowire Transistors Functionalized with Bis(terpyridine)-Fe(II) Molecules: Dependence on Molecular Structure", J. Am. Chem. Soc., vol. 126, 2004, pp. 7750-7751.

H.E. Katz et al., "Polar Orientation of Dyes in Robust Multilayers by Zirconium Phosphate-Phosphonate Interlayers", Science, vol. 254, pp. 1485-1487, 1991.

Z. Guo et al., "Electrochemistry and Electrogenerated Chemiluminescence of $SiO2$ Nanoparticles/Tris(2,2'-bipyridyl)ruthenium(II) Multilayer Films on Indium Tin Oxide Electrodes", Analytical Chemistry, vol. 76, No. 1, 2004, pp. 184-191.

H. Hofmeier et al., "Recent developments in the supramolecular chemistry of terpyridine-metal complexes", Chem. Soc. Rev., vol. 33, 2004, pp. 373-399.

M. Maskus et al., "Synthesis and Characterization of Redox-Active Metal Complexes Sequentially Self-Assembled onto Gold Electrodes via a New Thiol-Terpyridine Ligand", Langmuir, No. 12, 1996, pp. 4455-4462.

* cited by examiner

RADIATION SENSITIVE SELF-ASSEMBLED MONOLAYERS AND USES THEREOF

This application is a continuation of co-pending application Ser. No. 11/445,326 filed Jun. 2, 2006, the entire contents of all are hereby incorporated by reference.

GOVERNMENT RIGHTS

The U.S. government may have rights in this invention due to funding from the Defense Advanced Research Projects Agency (DARPA) under Contract N66001-00-C-8083.

FIELD OF THE INVENTION

The invention relates to multi-functional compounds used to form molecular assemblies and the use of the molecular assemblies as thin-film resists in lithographic applications.

BACKGROUND OF THE INVENTION

The fabrication of small patterned features with a desired functionality is important in a wide variety of fields and applications. Improvements in lithographic techniques to decrease image dimensions have allowed the microelectronics industry to fabricate denser and faster microelectronics chips. Traditional resist technology, however, is rapidly reaching the limits of achievable dimension reductions. Consistent production of sub-60 nm linewidths will require advances beyond the current approaches.

As the size of microelectronic devices shrink, it becomes necessary to define ever smaller features—current manufacturing lines produce sub 70 nm features. Resolving features in this size range requires the use of 193 or 157 nm optical exposures, or electron beam (e-beam) radiation and very thin resist films. Traditional resist films contained phenolic resins that had a moderate resistance to "dry" transfer methods such as reactive ion etching (RIE). Due to the high absorbance of phenolic moieties at wavelengths below 200 nm, resists for deep UV exposure must be primarily aliphatic or cycloaliphatic. The aliphatic polymers used as resist films in the deep UV regime are less etch resistant than traditional phenolic resins. To achieve high resolution, the aspect ratio of the resist thickness to the width of the features must be kept comparable, so it may not be possible to increase the thickness of the resist to compensate for its poorer etch performance.

In addition, the use of high numerical aperture lenses to increase the resolution of optical exposures is reducing the depth of focus of the tools, which also pushes towards the use of very thin resist films. Another problem that occurs when creating fine lithographic features is collapse of resist lines. Even for relatively thin resists (0.1-0.3 um) the wet development step often causes line collapse due to surface tension effects of the aqueous developers and rinses on features with high aspect ratios (Jung, M-H, et al., *Proceedings SPIE*, Vol. 5039, 1298, 2003).

Line edge roughness is another significant concern in the sub-100 nm feature regime. Traditional resists are composed of polymer chains with "protected" side groups that can react with acids. Photoacid generators produce acids when exposed to light, which then diffuse in the film and catalyze the deprotection of the polymer chain, allowing it to become soluble in the basic developer. The roughness of lithographic features defined by this process can be related to both the size of the polymer chains dissolving out of the film and by the diffusion length of the photoacids (Yoshimura, T., et al., *Japan. J. Appl. Phys.*, Vol. 32, 6065, 1993). For features in the sub-100 nm regime, both of these sources of line edge roughness are important.

Self-assembled monolayers (SAMs). It is well known that organic molecules containing certain terminal head groups will self assemble from solution to form monolayers on specific surfaces (Ulman, A., *An Introduction to Ultrathin Organic Films*, Academic Press, Chap. 3, 1991). The most common monolayers are formed from organic thiols which attach to gold substrates, organic alkoxy or chloro silanes which react with silicon dioxide, or phosphonic acids, hydroxamic acids, or carboxylic acids which react with metal oxides (Taylor, C. et al., *Langmuir*, Vol. 19, 2665, 2003). The monolayers are stabilized by the chemisorption of the head group to the surface and the formation of covalent bonds (in the case of silanes or thiols) or ionic bonding (in the case of acids) of the terminal head group with the surface, as well as intermolecular interactions between the molecules such as van der Waals forces, pi-pi interactions or hydrogen bonding.

Self-assembled monolayers are prepared by placing substrates in a solution containing from 0.1 mM to about 1% of the molecules forming the monolayer in a non-reactive, low boiling solvent. The self-assembly process may take from a few minutes up to a day or more to form complete, dense monolayers (Ulman, A., *An Introduction to Ultrathin Organic Films*, Academic Press, Chap. 3, 1991).

There are various examples of monolayers with terminal tail groups that can bind to metal ions or metal complexes, including phosphonic acids which bind to Zr or Hf (Fang, M., et al., *J. Am. Chem. Soc.*, Vol. 119, 12184, 1997), pyridine which binds to metals or metal complexes such as Rh complexes (Lin, C. et al., *J. Am. Chem. Soc.*, Vol. 125, 336, 2003) or Zr complexes (Hatzor, A. et al., *Langmuir*, Vol. 16, 4420, 2000), or terpyridine which is capable of binding to a variety of metal ions (Hofmeier, H., et al., *Chem. Soc. Rev.* Vol. 33, 373, 2004; Maskus, M., et al., *Langmuir*, Vol. 12, 4455, 1996) The metal/monolayer complexes will self assemble in solution through the chelation of the metal ions/complexes by the tail group of the monolayer.

The initial metal/monolayer complexes may in some cases be extended into multilayer structures through the use of difunctional "linking ligands", such as diphosphonic acids, dipyridines, diisocyanides or diterpyridines. By sequential exposure to the linking ligand and the metal species, layers may be built up on the original monolayer/metal complex. Films with at least 30 ligand/metal bilayers have been assembled in this fashion (Lin, C. et al., *J. Am. Chem. Soc.*, Vol. 125, 336, 2003).

The concept of using monolayers as ultrathin resists had been proposed and explored by others. Long chain alkyl thiols or silanes have been patterned using UV light or e-beam radiation (Smith, R., et. al., Prog. Surf. Sci., Vol. 75, 1, 2004; Ryan, D., et. al., Langmuir, Vol. 20, 9080, 2004; Zharnikov, M., et. al., J. Vac. Sci. Technol. B, Vol. 20, 1793, 2002; Calvert, J. Vac. Sci. Technol. B, Vol. 11, 2155, 1993). However, the monolayer films that have been proposed to date do not have sufficient RIE etch resistance to transfer images using standard dry etching techniques.

SUMMARY OF THE INVENTION

The invention is directed to a radiation sensitive compound comprising a surface binding group proximate to one end of the compound for attachment to a substrate, and a metal binding group proximate to an opposite end of the compound. The metal binding group is not radiation sensitive. The radiation sensitive compound also includes a body portion disposed between the surface binding group and the metal binding group, and a radiation sensitive group positioned in the body portion or adjacent to the metal binding group. The surface binding group is capable of attaching to a substrate selected from a metal, a metal oxide, or a semiconductor material.

In one embodiment, the invention is directed to a radiation sensitive compound of formula I $$SB\text{-}BP\text{-}MB\text{-}RS \qquad \qquad I$$

wherein SB is a surface binding group; BP is a body portion; MB is a metal binding group; and RS is a radiation sensitive group. The radiation sensitive group is displaced from the metal binding group upon exposure to UV or e-beam radiation, thereby activating the metal binding group to interact with a metal species.

In another embodiment, the invention is directed to a radiation sensitive compound of formula II $$SB\text{-}RSBP\text{-}MB \qquad \qquad II$$

wherein SB is a surface binding group; MB is a metal binding group; and RSBP is a body portion that includes a radiation sensitive group. Upon exposure to UV or e-beam radiation the metal binding group is displaced from the compound. The radiation sensitive group in the body portion is not an amine.

The invention is also directed to a lithographic process for patterning a substrate comprising: providing a substrate and attaching a plurality of radiation sensitive compounds to the substrate, wherein the radiation sensitive compounds include a surface binding group for attachment to the substrate and a metal binding group; exposing the surface attached radiation sensitive compounds to UV or e-beam radiation; and complexing the metal binding group of the radiation sensitive compounds with a metal species selected from a metal cation, metal compound, or metal or metal-oxide nanoparticle to form metallized radiation sensitive compounds in a predetermined pattern on the substrate.

BRIEF DESCRIPTION OF THE DRAWINGS

These and other features of the present invention will become apparent upon consideration of the following description of the invention when read in conjunction with the drawings, in which.

DETAILED DESCRIPTION OF THE INVENTION

Figure 1:
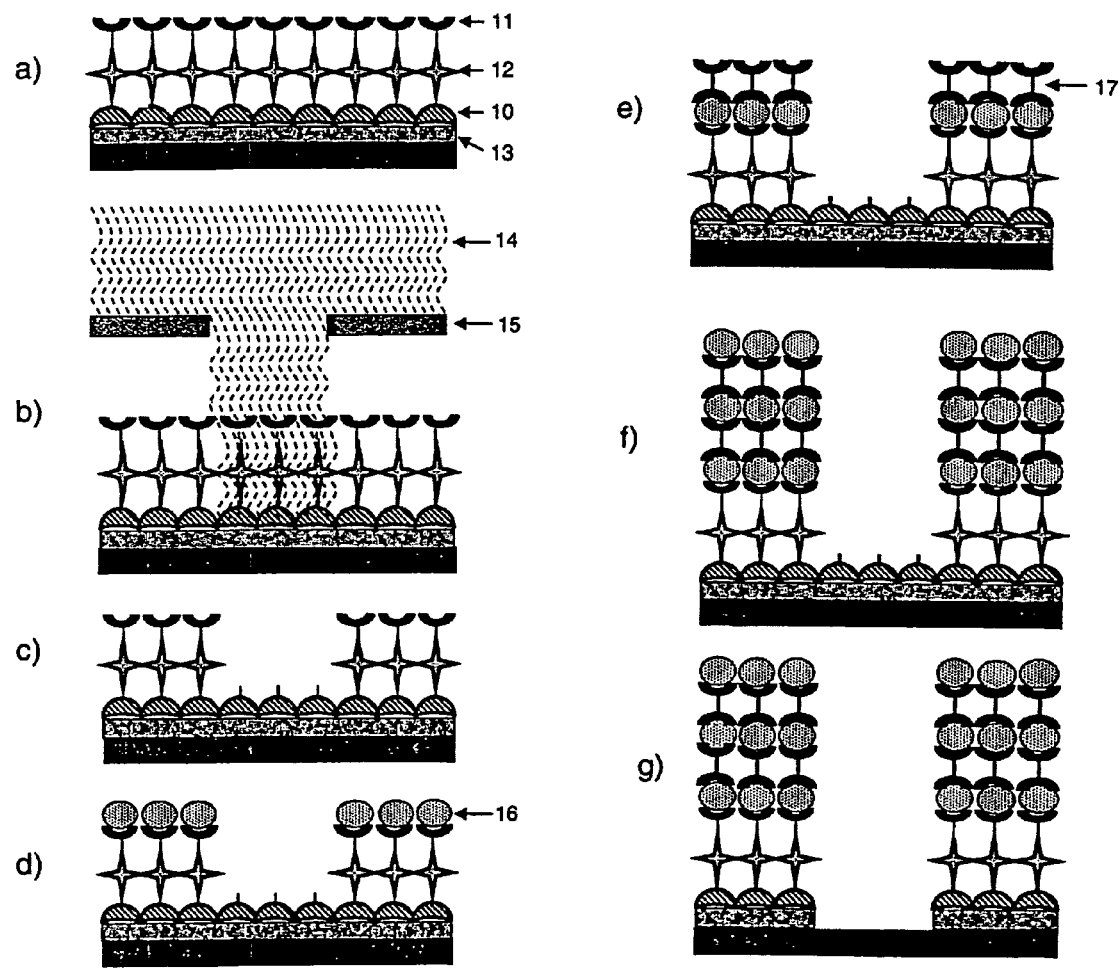
FIG. 1(a)-1(g) is a schematic representation of a process of the invention related to the forming of a "positive tone" resist film.

The present invention is directed to radiation sensitive compounds comprising: a surface binding group proximate to one end of the compound for attachment to a substrate; a metal binding group proximate to an opposite end of the compound (NOTE: it may not be at the opposite end of the molecule if the radiation sensitive group is the terminal group); a body portion disposed between the surface binding and the metal binding groups; and a radiation sensitive group positioned in the body portion or adjacent to the metal binding group. The body portion provides a sufficient intermolecular interaction with neighboring molecules attached to the substrate to form a monolayer on the substrate. The radiation sensitive group controls the ability of the monolayer to coordinate metals, either by cleaving the metal binding group from the monolayer upon irradiation in the case of "positive tone" monolayers, or by cleaving from the metal binding group and allowing it to coordinate metals in the case of "negative tone" monolayers. Also, the metal binding group of the radiation sensitive compounds are not radiation sensitive.

The term "radiation sensitive" refers to the breakage of covalent chemical bonds in a particular position of the compound upon exposure to ultraviolet (UV) or electron beam (e-beam) radiation under lithographic conditions. A metal binding group is not radiation sensitive if the metal binding group attached to the body portion of the compound retains the capability of interacting with a metal species following exposure to UV or e-beam radiation. A metal binding group that is activated towards metal species interactions by displacement of a radiation sensitive group adjacent to the metal binding group is not itself radiation sensitive. An amine group is one example of a radiation sensitive metal binding group.

The radiation sensitive compounds can function as negative or positive thin-film resists for use in lithography depending upon the position of the radiation sensitive group in the compound. In particular, the radiation sensitive compounds are designed for high resolution (sub-100 nm) lithography that utilizes UV and e-beam radiation.

In one embodiment, the exposure of the radiation sensitive group to radiation results in the cleaving of the metal binding group from the body portion of the compound. Consequently, the exposed compound can no longer bind metals, and thereby functions as a positive tone resist.

In another embodiment, the exposure of the radiation sensitive group to radiation results in the cleaving of the radiation sensitive group from the compound at a position adjacent to the metal binding group, and thereby activates the metal binding group to complex with a metal species. Consequently, the metal binding group of the exposed molecular precursor is activated toward metallization, thereby functioning as a negative tone resist.

It is to be understood that one of ordinary skill in the art can design any number of radiation sensitive compounds with each compound having a surface binding group, a metal binding group, a body portion and a radiation sensitive group. In one embodiment, the invention is directed to a radiation sensitive compound of formula I $$SB\text{-}BP\text{-}MB\text{-}RS \qquad \qquad I$$

SB is a surface binding group, BP is a body portion, MB is a metal binding group and RS is a radiation sensitive group. The radiation sensitive group is displaced from the metal binding group upon exposure to UV or e-beam radiation, thereby activating the metal binding group to interact with a metal species.

In another embodiment, the invention is directed to a radiation sensitive compound of formula II $$SB\text{-}RSBP\text{-}MB \qquad \qquad II$$

Again, SB is a surface binding group and MB is a metal binding group. However, the radiation sensitive group is positioned in the body portion of the compound and identified as RSBP. The radiation sensitive group in the body portion is not an amine. In this case, the radiation sensitive group can cause cleavage of the metal binding group from the compound upon exposure to UV or e-beam radiation.

Examples of surface binding groups that can be incorporated into the compounds for interacting with or binding to a particular substrate surface with chemical specificity include one or more of the functional groups selected from a phosphine, phosphonic acid, carboxylic acid, thiol, epoxide, amine, imine, hydroxamic acid, phosphine oxide; phosphite, phosphate, phosphazine, phosphonic acid, azide, hydrazine, sulfonic acid, sulfide, disulfide, aldehyde, ketone, resorsinol, silane, germane, arsine, nitrile, isocyanide, isocyanate, thiocyanate, isothiocyanate, amide, alcohol, selenol, nitro, boronic acid, ether, thioether, carbamate, thiocarbamate, dithiocarbamate, dithlocarboxylate, xanthate, thioxanthate, alkylthiophosphate, dialkyldithiophosphate or any combination thereof.

Some of the more preferred surface binding groups include:

a. thiols that bind to metal and semiconductor surfaces (e.g. Au, Pd, Pt, AuPd, Si, Ge, GaAs, Cu);

b. Selenols that bind to a similar group of metals and semiconductors as thiols c. isocyanides that bind to metal surfaces;

d. phosphonic acids, hydroxamic acids, carboxylic acids, suflonic acids or resorsinols that to bind to metal oxide surfaces (e.g. aluminum oxides, zirconium oxides and hafnium oxides);

e. hydroxamic or carboxylic acids—which bind to metals and metal oxides f. chloro and alkoxy silanes that bind to silicon oxide surfaces; and g. dienes alcohols, and aldehydes that bind to silicon surfaces.

Examples of metal binding groups that can be incorporated into the compounds include:

a. nitrogen heterocycles such as pyridine, dipyridine or terpyridine. These sigma donating nitrogen ligands can bind to a variety of metals at different oxidation states across the periodic table such as those of Group IV (Ti, Zr and Hf), Group V (Nb and Ta), Group V (Cr, Mo and W), Group VI (Mn and Re) and Group vm metals (Fe, Co, Ni, Ru, Rh, Pd, Os, Ir and Pt);

b. phosphonic acids that selectively bind to metal ions including Zr and Hf;

c. sulfonic acids that selectively bind to metal ions including Fe; and d. isocyanides, that selectively bind to Group VIII metals as well as some early transition metals.

Examples of radiation sensitive groups that can be incorporated into the compounds include:

a. nitrobenzyl groups;
b. benzyl ether groups;
c. succinimidyl sulfonic acid groups; and
d. alkyl thiols or disulfides.

Compounds A, B, C and D are some examples of radiation sensitive compounds of the invention, and thus, compounds that can be used in photolithography to pattern a substrate. Each of the compounds have a surface binding group (SB); A, Si(OCH$_3$)$_3$; B, PO(OH)$_2$; C, thiol; and D, hydroxamic acid. Each of the compounds have a metal binding group (MB); A, PO(OH)$_2$; B, pyridine; C, terpyridine; and D, S(O)$_2$OH. Each of the compounds have a radiation sensitive group (RS); A, nitrobenzyl; B, benzyl ether; C, carbon-sulfur bond; and D, succinimidyl. Compounds B and C have radiation sensitive groups positioned in the body portion, and therefore, the metal binding group is displaced upon exposure of the compounds to radiation. Compounds A and D have radiation sensitive groups adjacent to the metal binding group, and therefore, the metal binding group is activated upon exposure. Again, compounds A to D are only exemplary, and thus, the invention is not restricted to these four compounds. For example, a particular radiation sensitive compound can be designed according to the device application and the type of radiation used for exposure.

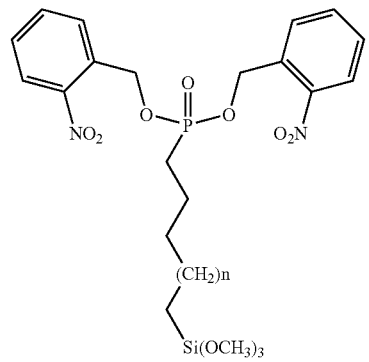

A

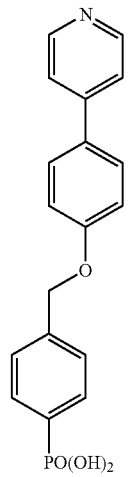

B

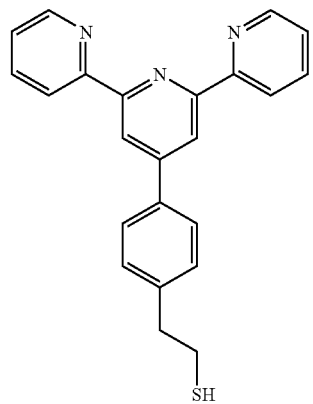

C

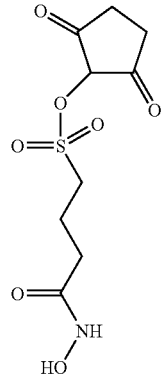

D

The radiation sensitive compounds can be used to provide ultra-thin (monolayer or multilayer) self-assembled films that can be patterned by standard lithographic exposure techniques such as e-beam or deep UV optical exposure systems. The radiation sensitive compounds of the invention are designed to form self-assembled films, and then selectively complex with metal species, e.g., metal ions or metal nanoparticles, that will improve the etch resistance of the films in plasma or reactive ion etching environments. Patterned images can then be transferred into oxide, metal, semiconductor, or hardmask layers beneath the self-assembled films.

FIG. 1(a) is a schematic representation depicting the radiation sensitive compounds in the form of an assembled monolayer on a substrate. As shown, the radiation sensitive compounds include a surface binding group 10 attached to the substrate 13, a metal binding group 11 and a radiation sensitive group 12 positioned in the body portion. FIG. 1(b) depicts the exposing of the monolayer of FIG. 1(a) with UV radiation 14 through an opening in mask 15 or by patterned e-beam radiation which does not require the use of a mask. FIG. 1(c) depicts the developed pattern following exposure. As shown, the radiation sensitive portion of the compounds exposed to the radiation have been displaced in-part from the monolayer leaving a predetermined pattern. Depending upon the radiation sensitive moiety, those compounds exposed can form small molecule residues that will either vaporize or can be rinsed from the surface by common solvents. The surface of the monolayer now contains regions with and without terminal metal binding capabilities. The monolayer is then contacted with a metal species 16, e.g., metal ions and the metal species will complex with the metal binding groups of the unexposed compounds, FIG. 1(d).

In some applications, one can rely on the metal film of the patterned monolayer to pattern the substrate. However, for many other applications the monolayer is insufficient, and a thicker film is needed with a greater density of metal species in the film. The build-up of the monolayer can continue by contacting the complexed metal species with a connecting ligand 17, FIG. 1(e). The process of contacting the connecting ligand with metal species and the complexed metal species with a subsequent connecting ligand can proceed any number of times until the desired thickness of the film and density of metal species is sufficient to provide a certain degree of etch selectivity, FIG. 1(f). Once the desired film thickness is obtained, the exposed portions of the substrate 13 can be etched resulting in a patterned substrate, FIG. 1(g).

Figure 2:
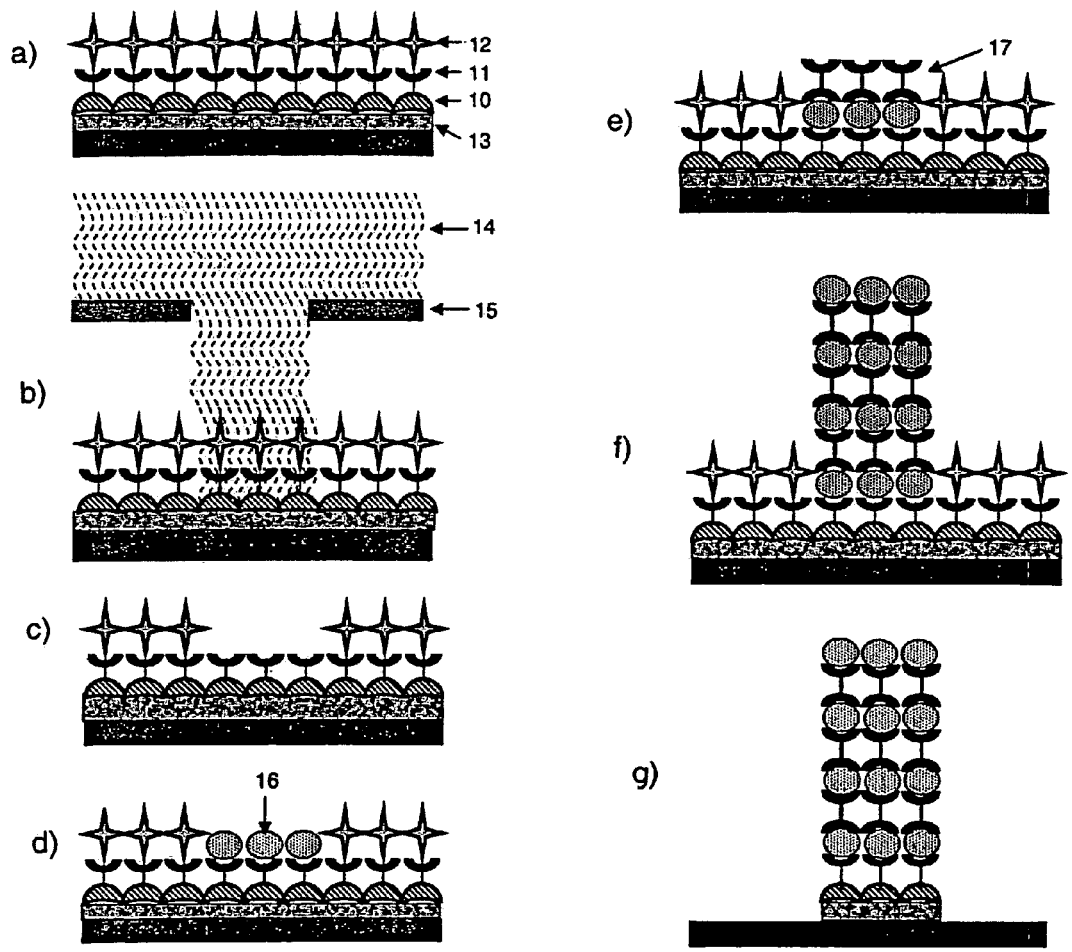
FIG. 2(a)-2(g) is a schematic representation of a process of the invention related to the forming of a "negative tone" resist film.

FIG. 2(a) is a schematic representation depicting the radiation sensitive compounds in the form of an assembled monolayer on a substrate. As shown, the radiation sensitive compounds include a surface binding group 10 attached to the substrate 13, a metal binding group 11 and a radiation sensitive group 12 adjacent to the metal binding group. The body portion of the radiation sensitive compounds that make up the monolayer is not shown, but it is disposed between the surface binding group 10 and the metal binding group 11. FIG. 2(b) depicts the exposing of the monolayer of FIG. 2(a) with UV or e-beam radiation 14 through an opening in mask 15 or through the use of patterned e-beam radiation. FIG. 2(c) depicts the developed monolayer following exposure. As shown, the radiation sensitive groups exposed to the radiation have been displaced from the metal binding groups in the monolayer leaving a predetermined pattern. The exposed portion of the monolayer is now available to complex with a metal species 16, e.g., metal ions, as the metal binding groups of the compounds have been activated toward complexation, FIG. 1(d).

In some applications, one can rely on the metal film of the patterned monolayer to pattern the substrate. However, for many other applications the monolayer is insufficient, and a thicker film is needed with a greater density of metal species in the film. The build-up of the monolayer can continue by contacting the complexed metal species with a connecting ligand 17, FIG. 2(e). The process of contacting the connecting ligand with metal species and the complexed metal species with a subsequent connecting ligand can proceed any number of times until the desired thickness of the film and density of metal species is sufficient to provide a certain degree of etch selectivity, FIG. 2(f). Once the desired film thickness is obtained, the unexposed portions of the substrate 13 can be etched resulting in a patterned substrate FIG. 2(g).

As described, the monolayer comprising the radiation sensitive compounds can provide the foundation upon which subsequent layers containing various metal species can be constructed. These subsequent layers are constructed using connecting ligands and subsequent attachment of the metal species. The radiation sensitivity of the assembled monolayer allows lithographic definition of regions of the substrate where layer-by-layer structures may or may not be fabricated. The incorporation of metal species into the ultra-thin resist layer increases its resistance to dry (reactive ion) etching techniques. The invention uses these metal-organic layers to create patterned features on surfaces that are of potential importance to a wide range of fields including silicon technology, carbon nanotube fabrication, nanoelectronics, electroless plating, sensors, biotechnology, and non-linear optics.

Some of the process advantages of the invention include:

1. the use of ultra-thin resist films will minimize the impact of a reduced depth of focus for many of the high energy optical exposure systems;

2. the use of ultra-thin resist films will minimize line collapse of fine features, which can result from surface tension effects on thick resist images;

3. the minimization of line edge roughness through the use of individual radiation sensitive compounds rather than large polymeric, molecules and photoacid generators that can diffuse outside the exposed region;

4. to provide a site selective patterned substrate for applications such as carbon nanotube (CNT) and nanowire growth or electroless plating, fabrication of field effect transistor (FET) device components including, but not limited to, contact or gate structures; and 5. to provide device structures for chemical or biological sensors, and non-linear optics.

In addition to use in traditional lithographic applications, the ability to selectively localize metal atoms on a range of surfaces may be useful in a wide range of applications. A technique that allows site specific deposition of selected metal ions or nanoparticles would permit molecules or supramolecular structures to be formed specifically where they are needed. This invention may allow the synthesis of nanotubes or nanowires at the site of use by patterning the required metal catalyst allowing nanotubes/wires to only form is specified areas, as described in U.S. patent application entitled "Spatially selective growth of carbon nanotubes and semiconductor nanowires using molecular assemblies", and assigned to International Business Machines Corporation.

The process of the invention can also be used to lithographically define very fine metal containing features where the metal acts as the seed layer or catalyst for electroless plating. It combines the resist and seed layers into one ultra-thin layer with the potential for very high resolution.

The patterned organic/metal assembly layers of the invention can be used in the fabrication of nanoscale FET or memory devices. The electrical properties of such devices can be controlled through the choice of the organic layer and metal species, e.g., select metal ions. Charge storage behavior, potentially useful in memory devices, has been demonstrated using iron/terpyridine complexes (Li, C., et al., J. Am. Chem. Soc., Vol. 126, 7750, 2004). Layer-by-layer organic/metal structures have also displayed non-linear optical properties (Katz, H. et al., Science, Vol. 254, 1485, 1991) as well as electrochemical and electrogenerated chemiluminescence (Guo, A., et al. Anal. Chem., Vol. 76, 184, 2004). The process of the invention allows lithographic definition of features with the specified functionality directly on the substrate of interest.

A monolayer comprising the radiation sensitive compounds of the invention can be formed by exposing an appropriate substrate to a dilute solution containing the compounds. For example, the substrate can be a top insulating layer such as an oxide or a top metal (metal alloy) layer deposited on another material such as silicon. Base metal, metal alloy and semiconductor substrates (Si, SiGe, GaAs) can also be used. Typical solutions contain 1 mM to 1% of the radiation sensitive compound in a non-interacting, low boiling solvent, and typical immersion times range from 20 minutes to overnight. An assembled radiation sensitive monolayer with a terminal metal binding group is depicted in FIG. 1(a), and one with a terminal radiation sensitive group is depicted in FIG. 2(a).

The metal species that can be used to complex with the metal binding groups include metal ions, metal complexes, or metal nanoparticles. The substrate containing the patterned monolayer with the terminal metal binding groups is placed in contact with a dilute solution of the appropriate metal species. The metals will tend to assemble on the metal binding groups, as depicted in FIGS. 1(d) and 2(d). Exemplary metal species include solutions of metal halides in alcohol or aqueous solutions, metal/organic complexes such as di-rhodium complexes in toluene solutions, or metal nanoparticles stabilized with alkylcarboxylic acids in solution in hexane or other nonpolar solvents.

As described, once the assembled monolayer includes the complexed metal species additional layers can be constructed on the monolayer using a connecting ligand. Again, the metal terminated assembly is placed in contact with solutions containing the connecting ligands to produce layered assemblies like those depicted in FIGS. 1(e) and 2(e). Exemplary connecting ligands include diterpyridines such as tetra-2-pyridinylpyrazine, dipyridines, such as dipyridinyl ethylene, or diphosphonic, sulfonic, or carboxylic acids. Typical ligand concentrations will be between 0.1-10 mM in appropriate solvents. The assembly of layer-by-layer structures can be constructed by alternate contact of the assembly layer(s) to metal-containing solutions and connecting ligand containing solutions until the film has attained the desired thickness.

Layer-by-layer films containing a significant content of metals may then be used as a barrier for dry or wet etching of the substrate, as depicted in FIGS. 2g and 3g. The etch resistance of the film may also be increased through the use of aromatic organic or highly fluorinated organic molecules as the linking ligands. It is also possible to grow patterned layer-by-layer films on thin, sacrificial etch barriers, such as hardmasks, initially transferring the image into the hardmask and using the patterned hardmask to transfer the image into the underlying structure.

The invention herein disclosed reduces or eliminates several problems with current lithographic resists for creating sub-100 nm features. The ultra-thin radiation sensitive monolayers (~10 to 20 Å) allow the possibility of true "top surface" imaging to optimize resolution and alleviate issues with depth of focus of advanced optical exposure systems. The films will not be subject to absorption concerns faced by thicker resist films in the deep UV. Due to their thickness and the aspect ratio of the features, these will not be subject to the surface tension effects which lead to collapse in thicker films. Edge roughness should also be minimized due to the use of individual radiation sensitive molecules rather than larger polymer chains with multiple reactive sites and photoacid generators that diffuse through the film.

A wide range of additional applications of the materials defined in this invention are also possible. Some of these applications may not require an extended or multilayer assembly structure. Films that are just prepared through step d) in FIG. 1 or 2 will have patterned regions containing a uniform layer of metal atoms. The appropriate selection of metal species can also be used as the seed or catalytic layer for patterned electroless plating. The plated features defined by this process could have much smaller dimensions than those formed through conventional lithographic definition of catalytic layers. Patterned metal containing regions could also be used as the catalyst for the site-specific synthesis of organic molecules for applications in molecular recognition such as the selective binding of biomolecules or in the creation chemical sensors. The patterning capabilities of metal/catalyst containing molecules described herein would allow for the fabrication of dense sensor arrays.

EXAMPLE 1

Mercaptophenylterpyridine (MPTP) which contains thiol, surface binding groups and terpyridine, metal binding groups was prepared (Auditore, A, et. al., Chem. Comm. 2494, 2003). An assembled monolayer comprising MPTP was prepared by immersing $O_2$ plasma cleaned gold substrates into a 1 mM solution of MPTP in 3:1 toluene:ethanol overnight. The presence of the MPTP monolayer was confirmed by both UV and FTIR spectroscopy.

The monolayer of MPTP was then exposed to 1-10 mM solutions of various metal halides in alcohol or water for 10 minutes including $RuCl_3$, $IrBr_3$, $RhCl_3$, $TiCl_3$, $SnCl_4$, $ZrCl_4$, $WCl_4$, and $CuCl_2$. Again, spectroscopic evidence (UV and FTIR) indicated the complexation of the metal ions to the MPTP. The substrates were then immersed in a 1 mM solution of tetra-2-pyridylpyrazine, a connecting ligand, in 1:1 ethanol:toluene solution for 10 minutes. The substrates were then cycled between immersion in the metal halide and the connecting ligand solutions to construct assembled multilayered films. The UV spectra of the films were recorded after each immersion and demonstrated relatively linear increases in absorbance consistent with uniform layered growth. In some cases, an assembled film with up to 20 bilayers of metal ions and connecting ligand were prepared. AFM measurements also indicated increasing film thicknesses that were consistent with the film thickness predicted from molecular modeling.

EXAMPLE 2

A monolayer of MPTP was exposed to 193 nm UV light (7.5 $J/cm^2$) and no residual absorbance in either UV or FTIR scans was observed, thus indicating complete reaction of the sulfur-carbon bond and removal of the portion of the molecule containing terpyridine. The exposed monolayer was also cycled through the solutions of metal halide and connecting ligand, and these did not demonstrate the increase in absorbance and film thickness as did the unexposed substrates of Example 1.

EXAMPLE 3

4-[N-(3-triethoxysilyl)propyl]-carbamoyl-2-nitrobenzyl isonicotinate (TCNI) which binds to silicon dioxide through the ethoxysilyl groups, and has a pyridine metal binding group and a nitrobenzyl radiation sensitive group was prepared according to the synthetic procedure represented in Scheme 2. 4-Bromomethyl-3-nitrobenzoic acid (A) was refluxed overnight with sodium carbonate in acetone/water (1:1). After cooling to room temperature, the reaction mixture was made acidic with 1 N hydrochloric acid and the product was extracted into ethyl acetate, dried over magnesium sulfate and rotary evaporated to yield 4-hydroxymethyl-3-nitrobenzoic acid. The 4-hydroxymethyl-3-nitrobenzoic acid (B) was dissolved in pyridine and reacted with isonicotinoyl chloride hydrochloride at room temperature for 2 days. The resultant solution was poured onto ice, stirred overnight at room temperature and extracted with ethyl acetate. The organics were dried over magnesium sulfate and rotary evaporated to remove the solvents. Residual pyridine was removed by the addition of toluene followed by rotary evaporation. The resultant solid was slurried in ethanol at room temperature and the product, 4-carboxy-2-nitrobenzyl isonicotinate, was isolated by filtration and dried under vacuum.

The 4-carboxy-2-nitrobenzyl isonicotinate (C) was treated with excess thionyl chloride and a few drops of dimethylformamide at room temperature for 45 minutes, followed by rotary evaporation to remove thionyl chloride and azeotropic removal of thionyl chloride by 3 additions of toluene followed by rotary evaporation to give 4-chlorocarbonyl-2-nitrobenzyl isonicotinate hydrochloride (D). The 4-chlorocarbonyl-2-nitrobenzyl isonicotinate hydrochloride (D) and excess triethylamine were dissolved in chloroform and cooled in an ice/acetone bath. A chloroform solution of 3-aminopropyltriethoxysilane was added dropwise and the reaction was allowed to warm to room temperature and stirred for 4 hours. The solvents were removed by rotary evaporation. The resultant mixture was treated with ether and filtered to remove salts. The filtrate was rotary evaporated and purified by flash chromatography on silica gel using ethyl acetate as the eluent to yield 4-[N-(3-triethoxysilyl)propyl]carbamoyl-2-nitrobenzyl isonicotinate.

Scheme 2

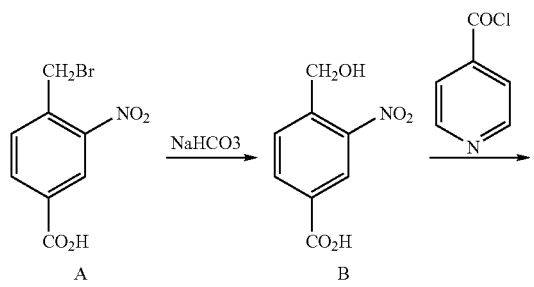

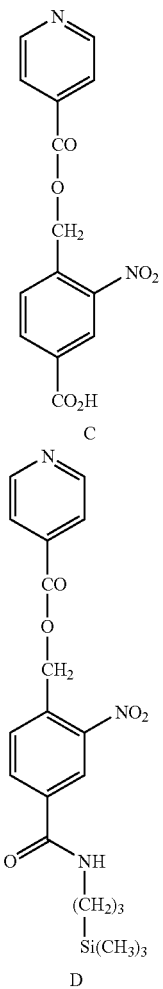

Monolayers of TCNI were prepared by immersing $O_2$ RIE cleaned silicon chips with 5000 Å of thermal oxide into a 1 mM solution of TCNI in dry toluene overnight. Upon removal from the solution the chips were rinsed in clean solvent and baked at 120 C for 10 minutes. Ten layers of metal ions and connecting ligands were built up on top of a TCNI monolayer as described in Example 1. Samples with $R^{3+}$, $Rh^{3+}$, and $Ir^{3+}$ were prepared. All samples, along with uncoated control chips, were etched in a RIE tool using $CHF_3$ and $O_2$ at a pressure of 50 mTorr and a power of 150 watts for 3.5 minutes.

The etch was designed to completely remove the film such that the maximum resistance of the film to RIE could be determined by the decrease in the loss of $SiO_2$ relative to the control samples. The chips with ten layers of $Ir^{3+}$ lost an average of 750 Å less oxide, the $R^{3+}$ layers lost an average of 500 Å less oxide, and the $Rh^{3+}$ lost 380 Å less oxide than the control samples. The predicted film thickness for a 10 layer film is about 90 Å, so all of the LBL films demonstrate etch resistances far greater than 1:1 (which is typical for organic resist films).

We claim:
1. A radiation compound being selected from the group consisting of the compounds represented by the following formulae:

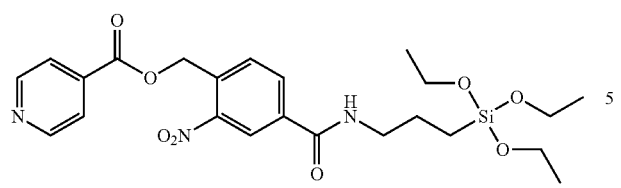
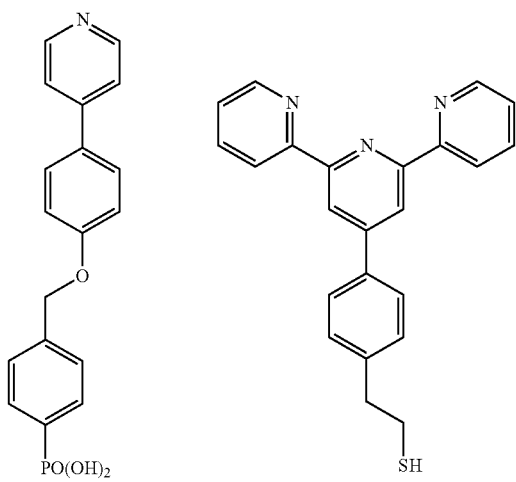
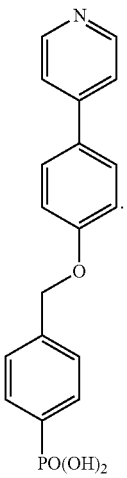
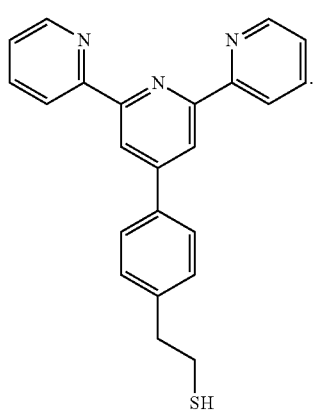
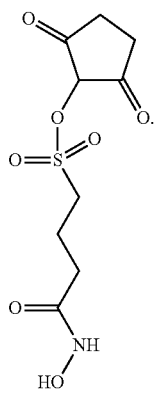
2. A radiation compound according to claim 1, represnted by the following formula
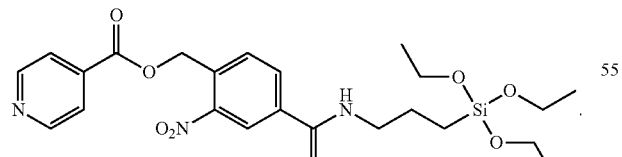
3. A radiation compound according to claim 1, represented by the following formula:
4. A radiation compound according to claim 1, represented by the following formula:
5. A radiation compound according to claim 1, represented by the following formula:
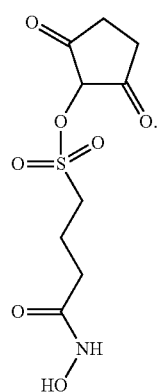
* * * * *